United States Patent [19]

Wojcik

[11] Patent Number: 4,953,460
[45] Date of Patent: Sep. 4, 1990

[54] METHOD AND APPARATUS FOR SCREEN PRINTING

[75] Inventor: Thaddeus Wojcik, Hopewell, N.J.

[73] Assignee: AT&T Bell Laboratories, Murray Hill, N.J.

[21] Appl. No.: 415,805

[22] Filed: Oct. 2, 1989

[51] Int. Cl.$^5$ .............................................. B41M 1/12
[52] U.S. Cl. ................................... 101/129; 101/127; 29/840; 29/829
[58] Field of Search .................. 101/127, 129; 29/829, 29/840; 427/97, 256; 118/301, 213, 406, 504; 425/811; 493/953

[56] References Cited

U.S. PATENT DOCUMENTS

| | | | |
|---|---|---|---|
| 3,363,552 | 1/1968 | Rarey | 101/127 |
| 4,872,261 | 10/1989 | Sanyal et al. | 101/127 |

FOREIGN PATENT DOCUMENTS 0267359  5/1988  European Pat. Off. ............ 101/127

OTHER PUBLICATIONS

D. S. Horne and A. Cundy, "Surface-Mount Solder Printing Guidelines", *Electronic Packaging & Production*, Feb. 1988, pp. 116–118.
S. K. Case and J. A. Thompson, "Intelligent Inspection Increases Yields in Solder Paste Printing", *Surface Mount Technology*, Jun. 1989, pp. 21–25.
Advertisement, DEK U.S.A., *Printed Circuit Board Assembly*, Jun. 1989, p. 17.

*Primary Examiner*—Edgar S. Burr
*Assistant Examiner*—Ren Yan
*Attorney, Agent, or Firm*—Robert B. Levy

[57] ABSTRACT

An improved stencil (10), for screen printing a material (22) onto a substrate (20), comprises a sheet (12) provided with a plurality of trapezoidal openings (14) arranged in alternating fashion such that the taper of each opening is opposite to the taper of the opening adjacent thereto. Providing the stencil with alternating trapezoidal openings (14) improves the resolution of the pattern of material (22) printed on the substrate when the material is deposited on the stencil and a squeegee blade (24) is displaced thereacross to force the material into the openings (14). The quality of the pattern of the material (22) printed on the substrate (20) can be further improved by providing a friction-reducing coating (34) on the sheet (12) to reduce the drag of the squeegee blade (24) as it travels thereacross.

5 Claims, 2 Drawing Sheets

METHOD AND APPARATUS FOR SCREEN PRINTING

TECHNICAL FIELD

This invention relates generally to a stencil, and a method of using the same, to stencil print viscous materials, such as solder paste, on a substrate.

BACKGROUND ART

Presently, many electronics manufacturers are employing an ever-increasing number of surface mount components in their products. Surface mount components, which possess leads or pads ("leads") adapted for bonding to metallized areas on a circuit board, can be made similar than corresponding through-hole components which have leads adapted for insertion in through holes in the board. As a consequence, a circuit board can be populated with a greater number of surface mount components than through-hole components, thus affording increased functionality.

The process of populating a circuit board with surface mount components is initiated by first applying a layer of solder paste onto the metallized areas on the board which to be bonded to the component leads. In practice, the paste, which is usually very viscous, is applied on the circuit board by a technique known as stencil printing. A stencil, having a pattern of openings corresponding to that of the paste pattern to be printed, is placed on the circuit board so that each stencil opening is in registration with a corresponding metallized area on the board. Solder paste is then applied to the stencil and a squeegee blade is thereafter displaced thereacross the stencil to force the paste into the stencil openings for deposit on the circuit board. Once the paste has been deposited (and the stencil is removed), the surface mount components are placed on the circuit board so that the leads of each sit on corresponding solder paste-coated metallized areas on the board. Following component placement, the paste is reflowed, typically by heating the circuit board, to bond the components to the board.

There is now a trend towards reducing the pitch or spacing between the leads to achieve greater lead density for a given component size. Efforts are now under way to reduce the lead pitch of surface mount components from the present-day value of 50 mils (1.27 mm.) to 25 mils (0.625 mm.) and below. Reducing the lead pitch necessitates that the pitch of the stencil openings be correspondingly reduced, which reduces the width of that portion of the stencil (hereinafter referred to as the "web") lying between adjacent stencil openings. As the width of the stencil webs decreases, so does their strength, increasing the likelihood that the webs will buckle, and/or distort as the squeegee passes over them. When the webs buckle, paste seeps underneath them and contaminates the undersurface of the stencil, requiring more frequent stencil cleaning. Distortion of the webs causes the paste pattern deposited on the circuit board to be distorted, which may lead to the formation of bridges between paste deposits on adjacent metallized areas on the circuit board.

Current attempts to solve the problem of printing fine pitch solder paste deposits have incurred difficulties. Making the stencil thicker to strengthen the webs causes the thickness of the solder paste deposits to increase, thereby increasing the amount of paste used, which drives up manufacturing costs. Moreover, increasing the height of the solder paste deposits increases the likelihood that solder bridges may form between adjacent component leads during paste reflow. Using more rigid materials for the stencil, such as stainless steel instead of brass which is conventional, will increase the strength of the webs. However, stainless steel and other such rigid materials are much more difficult to etch so that manufacturing stencils from these materials is often impractical.

Thus, there is a need for a technique for stencil printing a fine pitch pattern of solder paste on a substrate.

BRIEF SUMMARY OF THE INVENTION

Briefly, in accordance with a preferred embodiment of the invention, a stencil for screen printing a viscous material onto a substrate comprises a sheet having at least a pair of trapezoidal openings. Each trapezoid opening has a pair of parallel ends and pair of tapered longitudinal sides. The openings are arranged in alternating fashion such that the taper of the longitudinal sides of each opening is opposite to the taper of the sides of the opening adjacent thereto. By making the stencil openings trapezoidal, and arranging them in alternating fashion, the stencil webs are less likely to distort and buckle when a squeegee passes thereover during printing of a viscous material on to the substrate.

In accordance with another aspect of the invention, a method is disclosed for screen printing a viscous material onto a substrate. The method is initiated placing a stencil, having at least a pair of trapezoidal openings, arranged in an alternating fashion, just above the substrate so as to be almost in contact therewith. A volume of viscous material is then placed on the stencil and a relative motion is thereafter imparted between the stencil and a squeegee blade in contact therewith so that the squeegee blade forces the viscous material through the stencil openings and onto the substrate. The fact that the openings are trapezoidal and are arranged in alternating fashion renders the stencil webs between adjacent openings more resistant to the force of the squeegee. As a result, there is less contamination of the undersurface of the stencil, and less distortion of the pattern of paste printed on the substrate.

DETAILED DESCRIPTION

Figure 1:
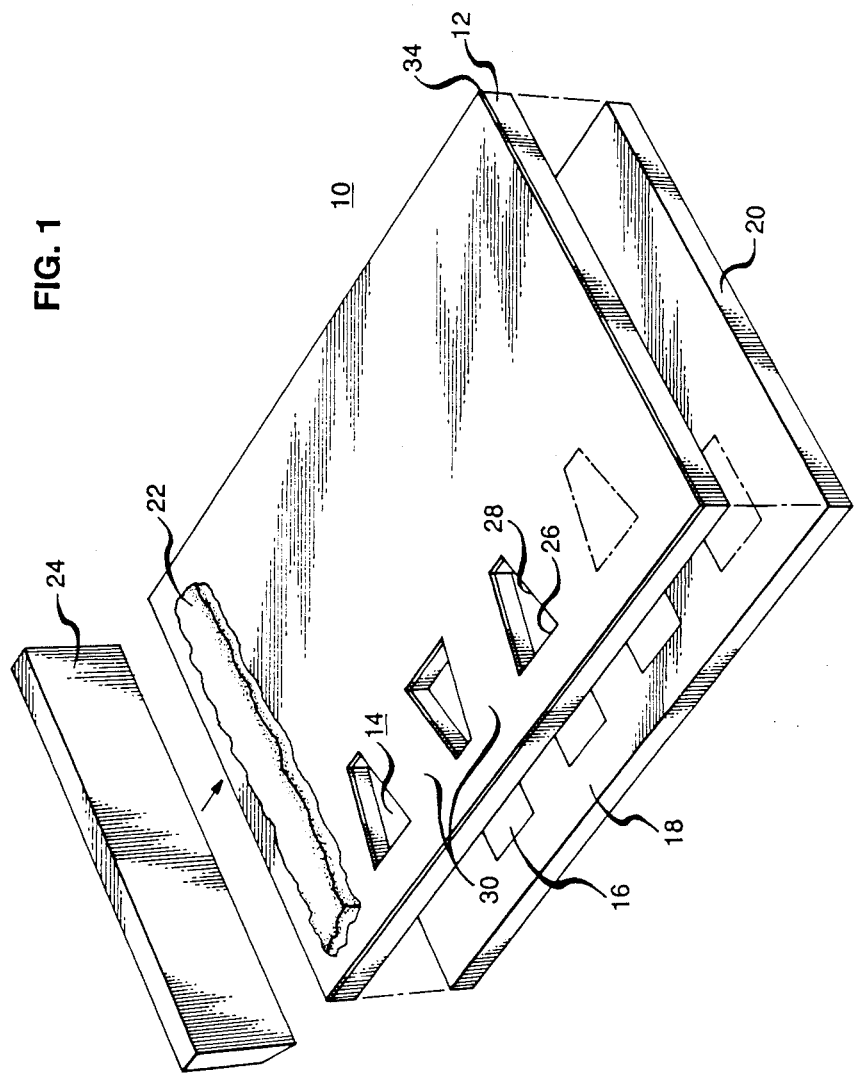
FIG. 1 is a partial perspective view of a stencil in accordance with a preferred embodiment of the invention.

FIG. 1 is a perspective view of a stencil 10, in accordance with the invention, which comprises a relatively thin sheet of metal 12 (e.g., brass) provided with a set of through-hole openings 14. The openings 14 in the sheet 12 are arranged in at least one pattern corresponding to a pattern of metallized areas 16 arranged on a major surface 18 of a substrate 20, such as a circuit board. Thus, when the stencil 10 is placed just above, so as to be spaced a short distance from, the circuit board 20 so that the openings 14 are aligned with the metallized areas 16, each area is at least partially exposed through its corresponding stencil opening. By placing a volume of viscous material 22 on the stencil 10, and then imparting a relative motion between the stencil and a resilient squeegee blade 24 in intimate contact therewith, the paste will be forced by the squeegee blade into the openings 14 and onto the metallized areas 16.

In accordance with the invention, each of the openings 14 is trapezoidal in shape, and has a pair of parallel ends 26 and a pair of tapered sides 28. The openings 14 are arranged in alternating fashion such that the taper of the sides 28 of each opening is opposite to the taper of the sides of the openings on either side thereof. Lying between the side 28 of one opening 14 and the side of the next adjacent opening is a portion 30 of the stencil hereinafter referred to as the stencil web.

Figure 2:
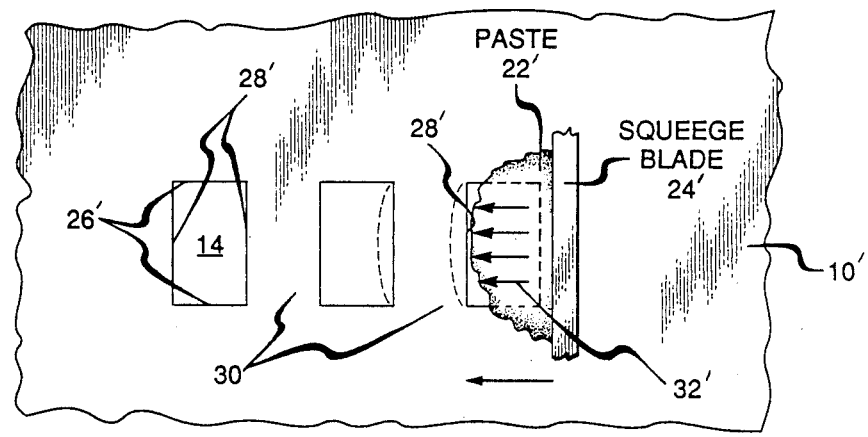
FIG. 2 is a plan view of a conventional stencil during the process of screen printing a viscous material onto a substrate.

Making the openings 14 trapezoidal in shape, and arranging them in alternating fashion, affords the stencil 10 a distinct advantage as compared to a prior art stencil 10' shown in FIG. 2. As will be explained, referring now to FIG. 2, the prior art stencil 10' is typically provided with at least one pattern of rectangular openings 14' which are shown arranged in a single row. For ease of discussion, the same reference numbers used in FIG. 1 will be used in FIG. 2 with the addition of a prime (') When printing with the stencil 10', a volume of solder paste 22' is placed on the stencil and a squeegee blade 24' is displaced across it in a direction parallel to the ends 26' of the rectangular openings 14' to push the paste into each opening. As the paste 22' is pushed by the squeegee blade 24' into each opening 14', the paste exerts a force against the side 28' of the opening distant from the blade. The force on the side 28' tends to be uniform along its length by virtue of the side being parallel to the squeegee blade 24'. The uniform force is represented by a plurality of arrows 32', pointing to, and uniformly spacfed along, the side 28'. The uniform force against the side 28' of the opening 14' causes the stencil 30' to distort and possibly buckle. The web 30', when distorted by the force of the paste 22', appears in the manner indicated by the dashed lines in FIG. 2. Distortion of the web 30' of FIG. 2 causes the pattern of paste printed by the stencil 10' to be distorted, which is undesirable. When the web 30' buckles, that is, when all or part the web is forced above the plane of the stencil 10', then the paste 22' pushed by the squeegee is likely to be forced underneath the web, thus contaminating the underside of the stencil. As a result, more frequent cleaning of the stencil 10' is thus required, increasing the frequency of downtime.

Figure 3:
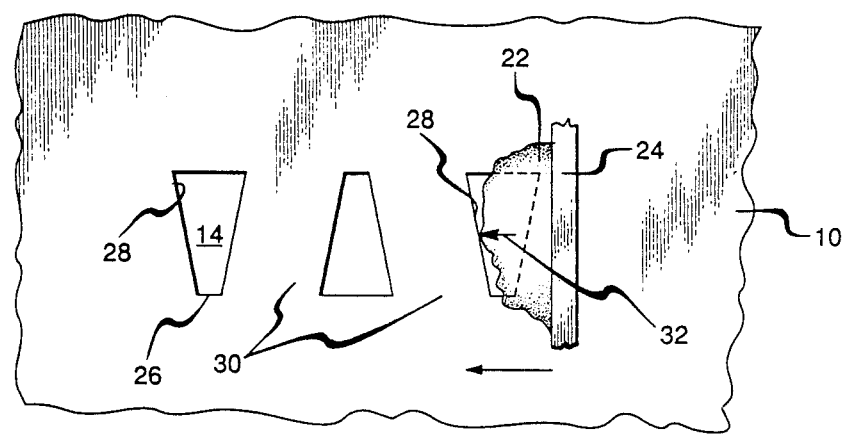
FIG. 3 is a plan view of the stencil of FIG. 1 during the process of screen printing a viscous material onto a substrate.

FIG. 3 shows a plan view of the stencil 10 of FIG. 2 as a relative motion is imparted between the squeegee blade 24 and the stencil so the squeegee travels in a direction parallel to the ends 26 of the openings 14. As the squeegee blade 24 and stencil 10 move relative to each other, the paste 22 is pushed by the blade into each opening 14. The paste 22 entering each opening 14 will exert a force on the tapered side 22 of the opening distant from the blade 24. Because the sides 28 of each opening 14 are tapered, that is to say, they are angled with respect to the blade 24, the force exerted by the paste 22 on the side distant from the blade is not uniform as with the stencil 10' of FIG. 2. Rather, the force on the side 28 of the opening 14 distant from the blade 24 tends to be a point force, as indicated by the single arrow 32 in FIG. 3. The point force is successively applied at different points along the side 22 as the blade 24 across the opening 14. The point force succcessively applied along the side 28 of the opening 14 causes much less distortion of the adjacent web 30, particularly when the openings are arranged in alternating fashion. As a consequence, distortion of the printed paste pattern obtained with the stencil 10 is significantly reduced, as is the incidence of buckling of the webs 30.

Making the openings 14 in the stencil 10 of FIGS. 1 and 3 trapezoidal in shape increases the width of each web 30 of FIG. 3 as compared to the webs 30' of FIG. 2. As a consequence, each web 30 is stronger, thus further reducing the problem of web distortion and buckling.

Referring to FIG. 1, the sheet 12 is provided with a friction-reducing coating 34 on its upper surface to reduce the drag of the squeegee 24, thus further reducing the incidence of distortion and buckling of the webs 36 (see FIG. 2). In a preferred embodiment, the coating 34 takes the form of "NEDOX-SF2," available from General Magnaplate, Linden, N.J., which is an electrolytic nickel impregnated with TEFLON ® that provides a hard surface with a low coefficient of friction. Other types of friction reducing coatings are known, and could be substituted if desired.

The foregoing discloses an improved stencil 10 for screen printing a viscous material 22 onto a substrate 20. The stencil achieves reduced incidence of distortion and contamination by virtue of its openings 14 being trapezoidal in shape and being arranged in an alternating pattern.

It is to be understood that the above-described embodiments are merely illustrated of the principles of the invention. Various modifications and changes may be made thereto by those skilled in the art which will embody the principles of the invention and fall within the spirit and scope thereof.

What is claimed is:

1. A stencil comprising:
   a substrate having at least a pair of trapezoidal openings, each of which has a pair of parallel ends and a pair of tapered longitudinal sides, the openings being arranged in alternating fashion such that the taper of the longitudinal sides of each opening is opposite to the taper of the sides of the openings adjacent thereto, thereby creating a web with tapered sides lying between the trapezoidal opening, the web having a greater resistance to buckling when a squeegee crosses the web in a direction along a path at an angle to the trapezoidal opening sides.

2. The stencil according to claim 1 wherein the substrate has a friction-reducing coating thereon.

3. The stencil according to claim 2 wherein the substrate is made from metal.

4. A method for depositing a material onto selected areas on a major surface of a substrate comprising the steps of:
   placing a stencil, having a plurality of trapezoidal openings arranged in alternating fashion in a pattern corresponding to that of the areas on the substrate on which material is to be deposited, just above the substrate so each area is aligned with a corresponding stencil opening;
   placing a volume of the material on the stencil; and
   imparting a relative motion between the stencil and a squeegee blade in contact therewith so that the squeegee blade travels across the stencil at an angle with a plurality of the tapered sides of the trapezoidal openings to reduce the incidence of buckling of the stencil portions (webs) lying between the trapezoidal openings while displacing the material across the stencil to force the material into the stencil openings and onto the areas on the substrate in alignment with the stencil openings.

5. A method of fabricating an assembly comprised of at least one electronic component having each of its leads bonded to a separate one of a plurality of metallized areas on a substrate, comprising the steps of:

placing a stencil, having a plurality of trapezoidal openings arranged in alternating fashion in a pattern corresponding to that of the metallized areas on the substrate, just above the substrate so each area is aligned with a stencil opening;

placing a volume of reflowable bonding material on the stencil;

imparting a relative motion between the stencil and a squeegee blade in contact therewith so that the squeegee blade travels across the stencil at an angle with a plurality of the tapered sides of the trapezoidal openings to reduce the incidence of buckling of the stencil portions lying between the trapezoidal openings while displacing the material across the stencil to force the material into the stencil openings and onto the metallized areas on the substrate in alignment with the stencil openings.

placing at least one component on the substrate such that each component lead is seated on a metallized area coated with bonding material; and reflowing the bonding material to bond the component leads to the metallized areas.

* * * * *